United States Patent
Nam et al.

(10) Patent No.: US 8,564,469 B2
(45) Date of Patent: Oct. 22, 2013

(54) PIPELINED ANALOG DIGITAL CONVERTOR

(75) Inventors: Jaewon Nam, Daejeon (KR);
Young-deuk Jeon, Daejeon (KR);
Young Kyun Cho, Daejeon (KR);
Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 38 days.

(21) Appl. No.: 13/309,872

(22) Filed: Dec. 2, 2011

(65) Prior Publication Data
US 2012/0146821 A1 Jun. 14, 2012

(30) Foreign Application Priority Data
Dec. 9, 2010 (KR) .................. 10-2010-0125775

(51) Int. Cl.
*H03M 1/38* (2006.01)
(52) U.S. Cl.
USPC .......................................... 341/161; 341/155
(58) Field of Classification Search
USPC .................. 341/162, 161, 155, 122, 120
See application file for complete search history.

(56) References Cited

U.S. PATENT DOCUMENTS

| | | | |
|---|---|---|---|
| 7,026,968 B1 * | 4/2006 | Ali ............................... | 341/120 |
| 7,486,216 B2 * | 2/2009 | Lee et al. .................... | 341/161 |
| 7,839,323 B2 | 11/2010 | Kidambi | |
| 2006/0145908 A1 * | 7/2006 | Lee .............................. | 341/161 |
| 2006/0187107 A1 * | 8/2006 | Kurose et al. ................ | 341/155 |
| 2007/0247348 A1 * | 10/2007 | Rezayee et al. ............. | 341/161 |
| 2008/0068237 A1 * | 3/2008 | Jeon et al. .................... | 341/122 |
| 2009/0085790 A1 * | 4/2009 | Lee .............................. | 341/162 |
| 2010/0328129 A1 * | 12/2010 | Chou ............................ | 341/159 |

FOREIGN PATENT DOCUMENTS

| | | |
|---|---|---|
| JP | 2007-201897 A | 8/2007 |
| KR | 1020020079862 A | 10/2002 |
| KR | 1020100080391 A | 7/2010 |

* cited by examiner

*Primary Examiner* — Jean B Jeanglaude

(57) ABSTRACT

A pipelined analog-to-digital converter includes a digital correction circuit configured to improve the complexity of a logic circuit for dividing a correction period and a no-correction period of a digital output. The pipelined analog-to-digital converter performs a logic correction operation via binary shifting at data error correction. Accordingly, although the resolution increases, it is possible to reduce the complexity and area of a logic circuit.

18 Claims, 8 Drawing Sheets

PIPELINED ANALOG DIGITAL CONVERTOR

CROSS-REFERENCE TO RELATED APPLICATIONS

This application claims the benefits, under 35 U.S.C §119, of Korean Patent Application No. 10-2010-0125775 filed Dec. 9, 2010, the entirety of which is incorporated by reference herein.

BACKGROUND

Exemplary embodiments relate to a pipelined analog-to-digital converter.

An image system such as HDTV may necessitate an high-performance analog-to-digital converter (hereinafter, referred to as ADC) which provides a high resolution of 10 bits to 12 bits and a high sampling speed of hundreds MHz. Among various ADC structures, a pipeline structure may have been used to satisfy high-speed signal processing and high-resolution conditions.

A typical pipelined ADC may have such a problem that its realization area increases according to an increase in a resolution of a lower conversion stage. Such a problem may be caused due to a decoder whose realization area increases in proportion to a bit number of a digital code output from a conversion stage at a digital correction operation. In particular, in case of the typical pipelined ADC, its logic complexity at the digital correction operation may increase because a conversion region of the conversion stage is used as an even-numbered period.

SUMMARY

A pipelined analog-to-digital converter is provided to reduce an area occupied by the pipelined analog-to-digital converter.

One aspect of embodiments of the inventive concept is directed to provide a pipelined analog-to-digital converter which comprises a conversion stage part including a plurality of serially connected conversion stages, each of the plurality of serially connected conversion stages converting an input voltage a B-bit digital code in response to at least one clock signal and outputting a residual voltage; and a data correction circuit configured to perform a logic correction operation by binary shifting the B-bit digital codes output from the plurality of serially connected conversion stages.

In this embodiment, each of the plurality of serially connected conversion stages comprises a multiplying digital-to-analog converter configured to convert a $(2^B-1)$-bit digital code into an analog signal in response to the at least one clock signal and to output the residual voltage by subtracting the converted analog signal from the input voltage; and an analog-to-digital sub-converter configured to convert the input voltage into the $(2^B-1)$-bit digital code and the B-bit digital code.

In this embodiment, the multiplying digital-to-analog converter comprises a sampler configured to sample the input voltage in response to a first clock signal; a digital-to-analog converter configured to convert the $(2^B-1)$-bit digital code into an analog signal in response to a second clock signal; a subtracter configured to subtract an output value of the digital-to-analog converter from an output of the sampler; and a residual voltage amplifier configured to output the residual voltage by amplifying an output value of the subtracter in response to the second clock signal.

In this embodiment, the first and second clock signals are complementary.

In this embodiment, the multiplying digital-to-analog converter performs a sampling operation in response to the first clock signal and a residual voltage amplifying operation in response to the second clock signal, and if one of continuous conversion stages in the conversion stage part performs a sampling operation, the other performs a residual voltage amplifying operation.

In this embodiment, the analog-to-digital sub-converter comprises a sampler configured to sample the input voltage in response to a first clock signal; a preprocessing amplifier string configured to amplify an output value of the sampler; a latch string configured to latch an output value of the preprocessing amplifier string in response to a second clock signal and to output the $(2^B-1)$-bit digital code; and a decoder configured to decode an output value of the latch string into the B-bit digital code.

In this embodiment, the digital correction circuit comprises a plurality of delay cells configured to delay the B-bit digital codes output from the plurality of serially connected conversion stages; and a subtracter/adder block configured to perform the logic correction operation by binary shifting the delayed digital codes corresponding to the plurality of serially connected conversion stages, respectively.

In this embodiment, the subtracter/adder block receives the delayed digital codes each corresponding to the plurality of serially connected conversion stages in response to a first clock signal.

In this embodiment, in continuous $i^{th}$ and $(i+1)^{th}$ conversion stages of the plurality of serially connected conversion stages, the logic correction operation is performed such that one bit of a first digital code output from the $i^{th}$ conversion stage is overlapped with one bit of a second digital code output from the $(i+1)^{th}$ conversion stage.

In this embodiment, when the second digital code output from the $(i+1)^{th}$ conversion stage is '000' or '001', '1' is subtracted from the first digital code at the logic correction operation.

In this embodiment, when the second digital code output from the $(i+1)^{th}$ conversion stage is '111' or '110', '1' is added to the first digital code at the logic correction operation.

In this embodiment, when the second digital code output from the $(i+1)^{th}$ conversion stage is '101', '100', '011', or '010', the first digital code is not corrected at the logic correction operation.

In this embodiment, the subtracter/adder block is configured to output the first digital code of the $i^{th}$ conversion stage as upper bits of a corrected digital code and remaining bits other than a most significant bit of the second digital code of the $(i+1)^{th}$ conversion stage as lower bits of the corrected digital code in response to a first signal. The subtracter/adder block comprises a subtracter configured to output a value, obtained by subtracting a first predetermined value from the first digital code of the $i^{th}$ conversion stage, as the upper bits of the corrected digital code in response to a second signal; a first adder configured to output a value, obtained by adding the first predetermined value to the first digital code of the $i^{th}$ conversion stage, as the upper bits of the corrected digital code in response to a third signal; a second adder configured to output a shift code by adding a second predetermined value to the second digital code; and a decoder configured to generate the first, second, and third signals in response to the shift code.

In this embodiment, the first signal is a first bit value of the shift code.

In this embodiment, the second signal is a value obtained by multiplying an inverted version of the first bit value of the shift code and a second bit value of the shift code.

In this embodiment, the third signal is a value obtained by multiplying an inverted version of the first bit value of the shift code and an inverted version of the second bit value of the shift code.

In this embodiment, the pipelined analog-to-digital converter further comprises a clock signal generator configured to generate the at least one clock signal.

In this embodiment, the pipelined analog-to-digital converter further comprises a reference voltage buffer configured to generate a reference voltage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
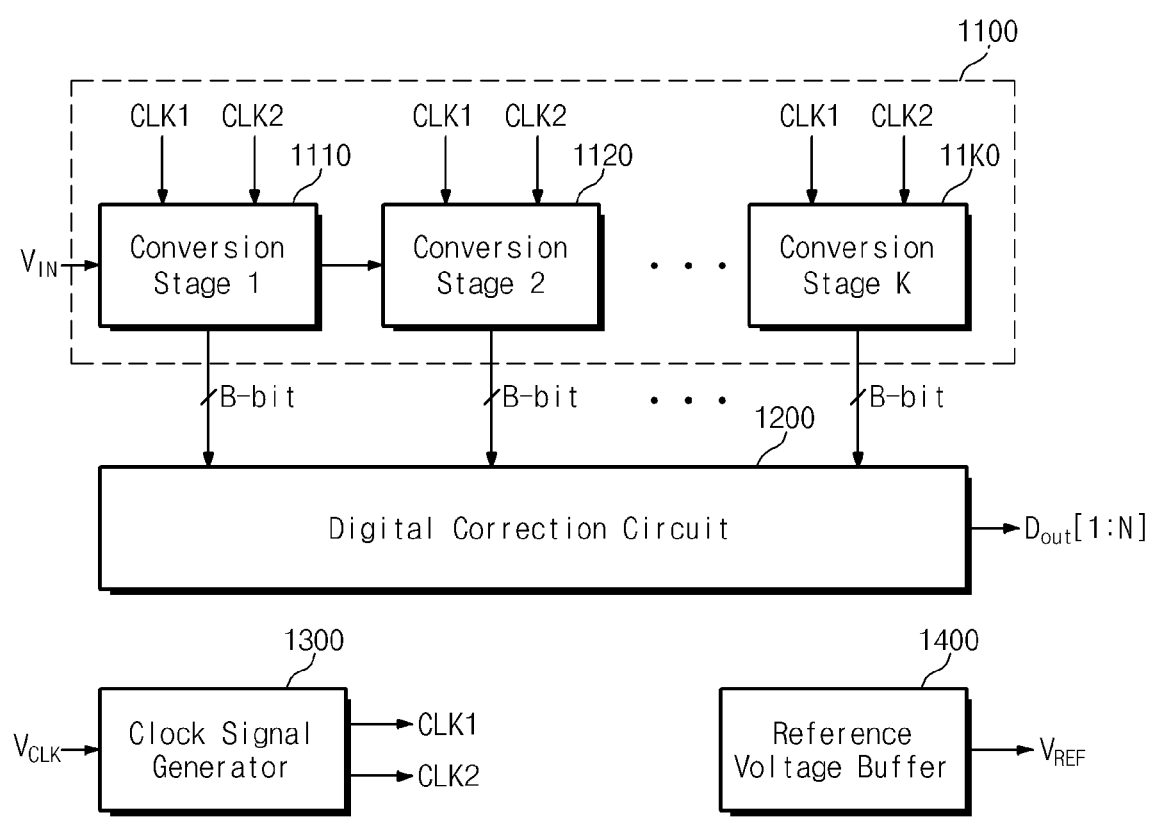
FIG. 1 is a block diagram illustrating a pipelined analog-to-digital converter according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a pipelined analog-to-digital converter according to an exemplary embodiment of the inventive concept. Referring to FIG. 1, a pipelined analog-to-digital converter (ADC) may include a conversion stage circuit 1100, a digital correction circuit 1200, a clock signal generator 1300, and a reference voltage buffer 1400.

The conversion stage circuit 1100 may include a plurality of conversion stages 1110 to 11K0 which are connected in series. Each of the conversion stages 1110 to 11K0 may convert an input voltage into a B-bit digital code and may output a residual voltage to a next stage. The conversion stages 1110 to 11K0 may be implemented the same.

The conversion stage circuit 1100 may include the conversion stage 1110 which is configured to convert an input signal $V_{IN}$ into a B-bit digital code and to output a residual voltage. Herein, the input signal $V_{IN}$ may be an analog signal, and 'B' may be a natural number.

Each of the conversion stages 1120 to 11K0 may be configured to receive a residual voltage from a previous stage in response to at least one clock signal (e.g., CLK1, CLK1P, and CLK2), to convert the residual voltage into a B-bit digital code, and to output a residual voltage to a next stage.

The digital correction circuit 1200 may receive digital codes from the conversion stages 1110 to 11K0 to make correction on the input digital codes via a logical correction operation. Herein, the logical correction operation may be made to solve defects caused due to an RF communication channel such as multipath interference, intersymbol interference (ISI), and fading. The digital correction circuit 1200 may output an N-bit digital code Dout (N being a natural number).

The digital correction circuit 1200 may perform a binary shift operation by adding a predetermined value (e.g., '010') to the digital codes output from the conversion stage circuit 1100, and may make a logical correction operation. The digital correction circuit 1200 may preprocess the binary shift operation to lower the complexity of a logic circuit for dividing a correction period and a non-correction period of a digital output.

The clock signal generator 1300 may receive a clock voltage $V_{CLK}$ to generate clock signals (e.g., CLK1, CLK2) necessary for a conversion operation.

The reference voltage buffer 1400 may generate a reference voltage $V_{REF}$ needed for the conversion operation.

A typical pipelined ADC may have such a problem that its realization area increases according to an increase in a resolution of a lower conversion stage. Such a problem may be caused due to a decoder whose area increases in proportion to a bit number of a digital code output from a conversion stage at a digital correction operation. In particular, in case of the typical pipelined ADC, its logic complexity at the digital correction operation may increase because a conversion region of the conversion stage is used as an even-numbered period.

However, a pipelined ADC according to an exemplary embodiment of the inventive concept may be configured to make binary shift on a digital code output from a conversion stage at a digital correction operation. Accordingly, it is possible to implement a logic circuit of a decoder and to reduce its realization area as compared with the typical ADC.

Figure 2:
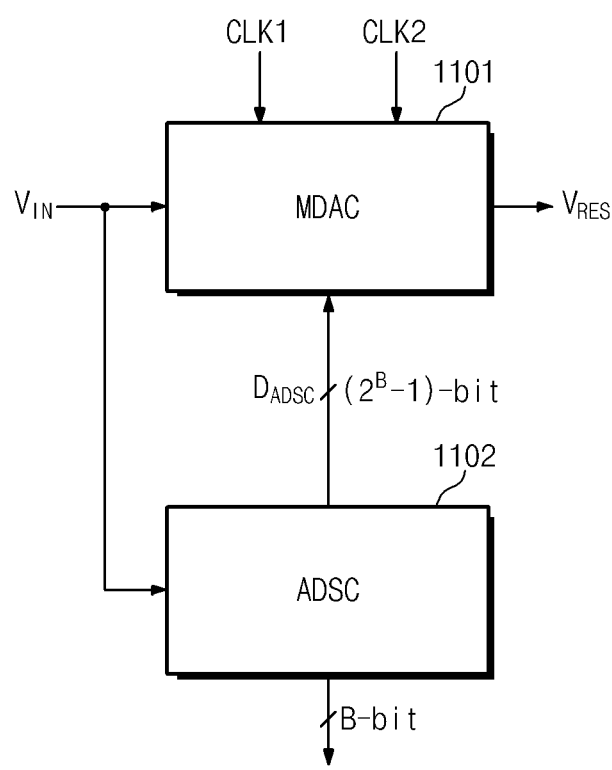
FIG. 2 is a block diagram illustrating a first conversion stage in FIG. 1.

FIG. 2 is a block diagram illustrating a first conversion stage in FIG. 1. Referring to FIG. 2, the first conversion stage 1110 may include a multiplying digital-to-analog converter (MDAC) 1101 and an analog-to-digital sub-converter (ADSC) 1102.

The MDAC 1101 may convert a ($2^B$-1)-bit digital code $D_{ADSC}$ into an analog signal in response to clock signals CLK1 and CLK2 and may output a residual voltage $V_{RES}$ by subtracting the converted analog signal from an input voltage $V_{IN}$.

The ADSC 1102 may convert the input signal $V_{IN}$ into a B-bit digital code and the ($2^B$-1)-bit digital code $D_{ADSC}$.

Figure 3:
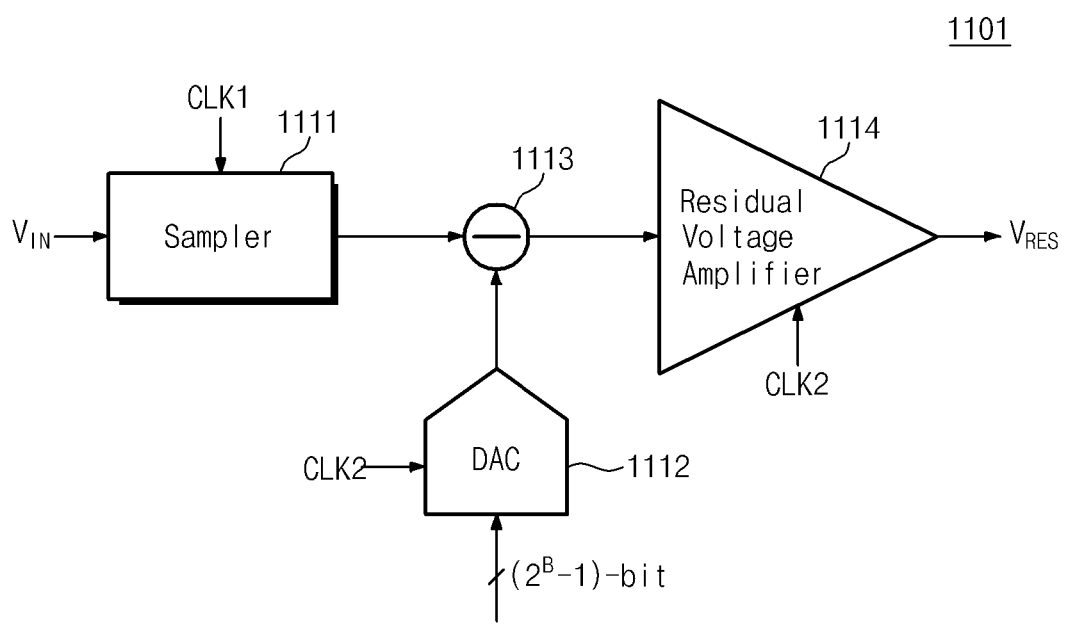
FIG. 3 is a block diagram illustrating a multiplying digital-to-analog converter in FIG. 2.

FIG. 3 is a block diagram illustrating a multiplying digital-to-analog converter in FIG. 2. Referring to FIG. 3, a multiplying digital-to-analog converter 1101 may include a sampler 1111, a digital-to-analog converter (DAC) 1112, a subtracter 1113, and a residual voltage amplifier 1114.

The sampler 1111 may be configured to sample an input signal $V_{IN}$ in response to the first clock signal CLK1.

The DAC 1112 may be configured to convert a ($2^B$-1)-bit digital code into an analog signal in response to the second clock signal CLK2.

The subtracter 1113 may be configured to subtract an output value of the DAC 1112 from an output value of the sampler 111.

The residual voltage amplifier 1114 may be configured to amplify an output value of the subtracter 1113 in response to the second clock signal CLK2. An output signal of the residual voltage amplifier 1114 may be a residual voltage $V_{RES}$.

Figure 4:
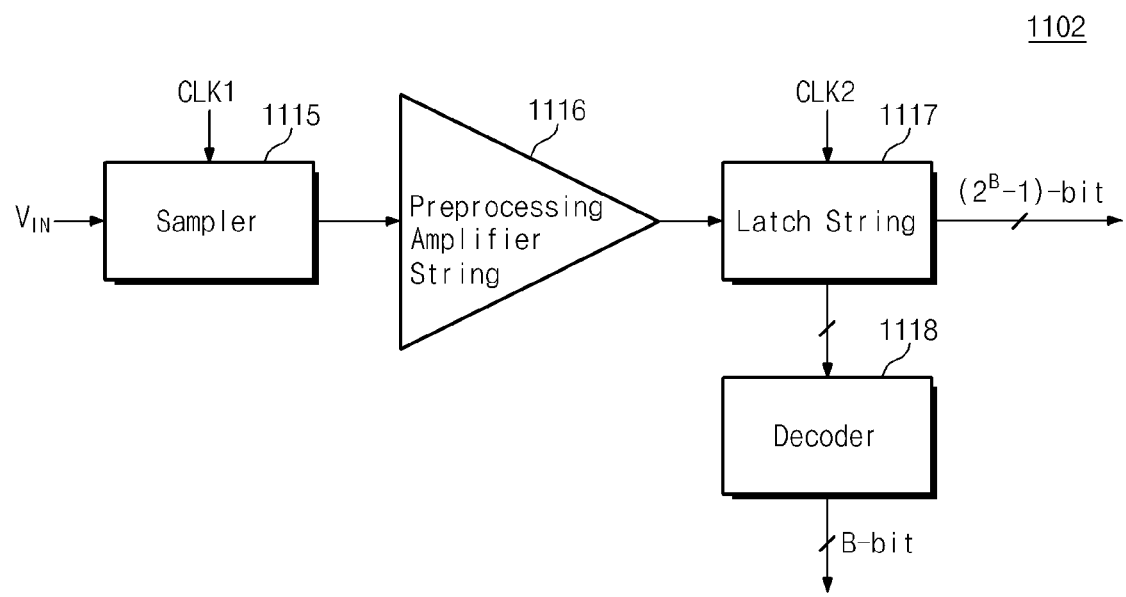
FIG. 4 is a block diagram illustrating a digital-to-analog sub-converter in FIG. 2.

FIG. 4 is a block diagram illustrating a digital-to-analog sub-converter in FIG. 2. Referring to FIG. 4, a digital-to-analog sub-converter 1102 may include a sampler 1115, a preprocessing amplifier string 1116, a latch string 1117, and a decoder 1118.

The sampler 1115 may be configured to sample an input signal $V_{IN}$ in response to the first clock CLK1.

The preprocessing amplifier string 1116 may be configured to amplify an output value of the sampler 1115.

The latch string 1117 may be configured to output a ($2^B$-1)-bit digital code by latching an output value of the preprocessing amplifier string 1116 in response to the second clock signal CLK2.

The decoder 1118 may be configured to output a B-bit digital code by decoding an output value of the latch string 1117.

Figure 5:
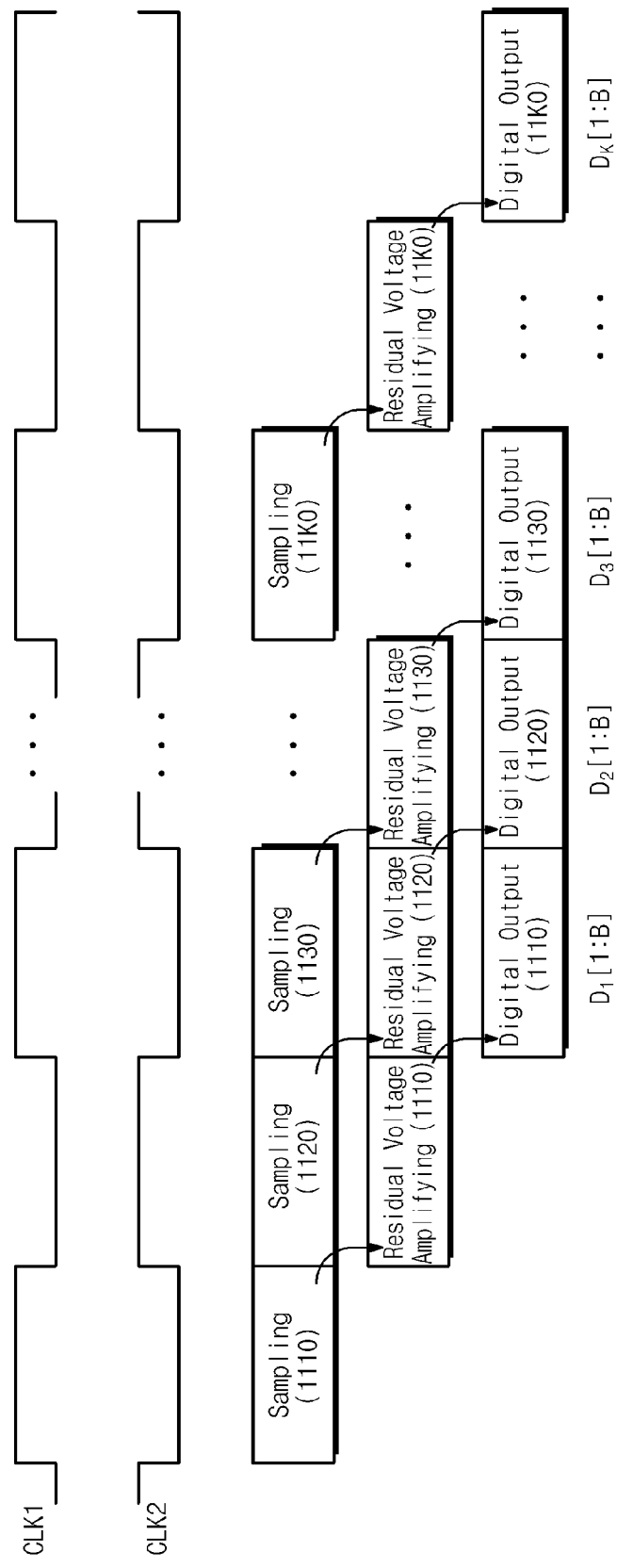
FIG. 5 is a timing diagram for describing an operation of a conversion stage circuit in FIG. 1.

FIG. 5 is a timing diagram for describing an operation of a conversion stage circuit in FIG. 1. Referring to FIG. 5, each of conversion stages 1110 to 11K0 in FIG. 1 may have an input signal sampling operation period, a residual voltage amplifying operation period, and a digital code output operation period in response to clock signals CLK1 and CLK2. Herein, the clock signals CLK1 and CLK2 may be complementary. The conversion stages 1110 to 11K0 may operate sequentially as illustrated in FIG. 5 and may output K B-bit digital codes $D_1[1:B]$ to $D_K[1:B]$.

Figure 6:
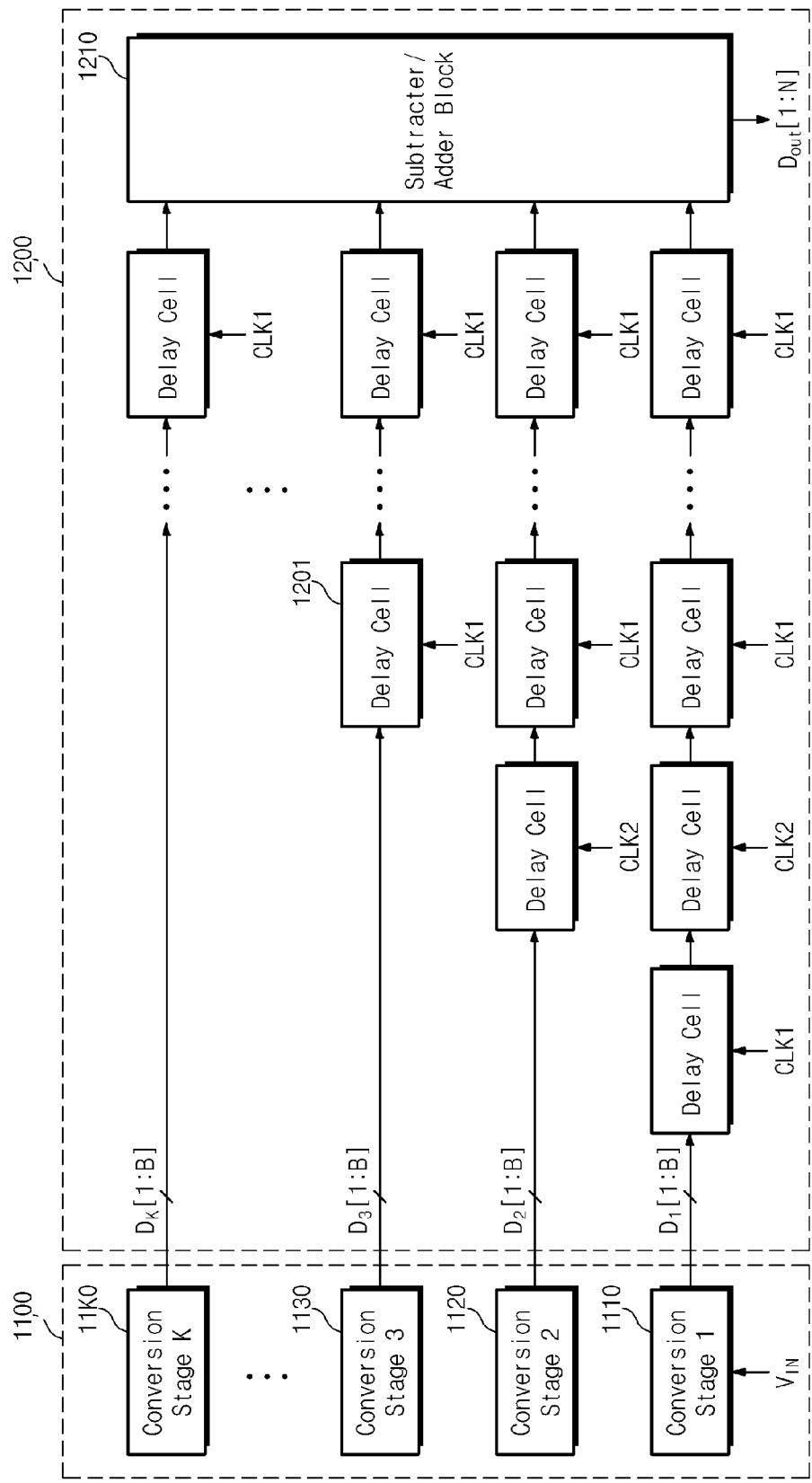
FIG. 6 is a diagram for describing an operation of a digital correction circuit in FIG. 1.

FIG. 6 is a diagram for describing an operation of a digital correction circuit in FIG. 1. Referring to FIG. 6, a digital correction circuit 1200 may include a plurality of delay cells 1201 and a subtracter/adder block 1210.

The delay cells 1201 may be configured to delay digital codes $D_1[1:B]$ to $D_K[1:B]$ and to simultaneously output the delayed digital codes $D_1[1:B]$ to $D_K[1:B]$ in response to a clock signal CLK1. In other words, the delay cells 1201 may sequentially delay the digital codes $D_1[1:B]$ to $D_K[1:B]$ input to the digital correction circuit 1200 as output digital codes of a conversion stage circuit 1100 (refer to FIG. 1) in response to clock signals CLK1 and CLK2.

The subtracter/adder block 1210 may make a logic correction operation on digital codes transferred via the delay cells 1201. Herein, the logic correction operation may be used for digital output signal demodulation of a pipelined ADC 1000 which is configured such that digital conversion regions of two continuous conversion stages are overlapped at a rear conversion stage by a 1-bit conversion period of a front conversion stage.

The logic correction operation may be divided into a correction period and a non-correction period according to a digital code $D_{i+1}$ of the $(i+1)^{th}$ conversion stage as follows.

When a digital code $D_{i+1}$ of the $(i+1)^{th}$ conversion stage is '111' or '110', '1' may be added to a digital code $D_i$ output from the $i^{th}$ conversion stage at the logic correction operation. When the digital code $D_{i+1}$ of the $(i+1)^{th}$ conversion stage is '001' or '000', '1' may be subtracted from a digital code $D_i$ output from the $i^{th}$ conversion stage at the logic correction operation.

When the digital code $D_{i+1}$ of the $(i+1)^{th}$ conversion stage is '101', '100', '011', or '010', at the logic correction operation, the digital code $D_i$ output from the $(i+1)^{th}$ conversion stage may not be corrected.

For example, if a digital code output from the $i^{th}$ conversion stage (i being an integer more than 1) is '101' and a digital code of the (i+1)$^{th}$ conversion stage is '111', the logic correction operation may be performed as expressed by the following equation 1.

$$D_i = 101$$
$$\underline{D_{i+1} = 111}$$ [Equation 1]
$$D_i[1:3] = 10100$$
$$D_{i+1}[2:3] = 00011$$
$$+ \phantom{D_{i+1}[2:3] =} 00100$$
$$D_{COR} \phantom{[2:3]} = 11011$$

A subtracter/adder of a typical pipelined ADC may determine a correction operation and a non-correction operation based upon all bits of a digital code $D_{i+1}$ output from the (i+1)$^{th}$ conversion stage. Expression of a decoder for performing a logic correction operation may be very complex.

On the other hand, the subtracter/adder block 1210 according to an exemplary embodiment of the inventive concept may binary shift a digital code $D_{i+1}$ output from the (i+1)$^{th}$ conversion stage and may determine a correction operation or a non-correction operation using a binary-shifted digital code (hereinafter, referred to as a shift code). Accordingly, it is possible to simplify expression of a decoder.

For example, the subtracter/adder block 1210 may make binary shift by adding '010' to a digital code $D_{i+1}$ output from the (i+1)$^{th}$ conversion stage and may determine a correction operation or a non-correction operation using a shift code. At this time, a correction operation or a non-correction operation may be determined simply. That is, the non-correction operation may be performed when an MSB of the shift code is '1', and the correction operation may be performed when an MSB of the shift code is '0'.

Figure 7:
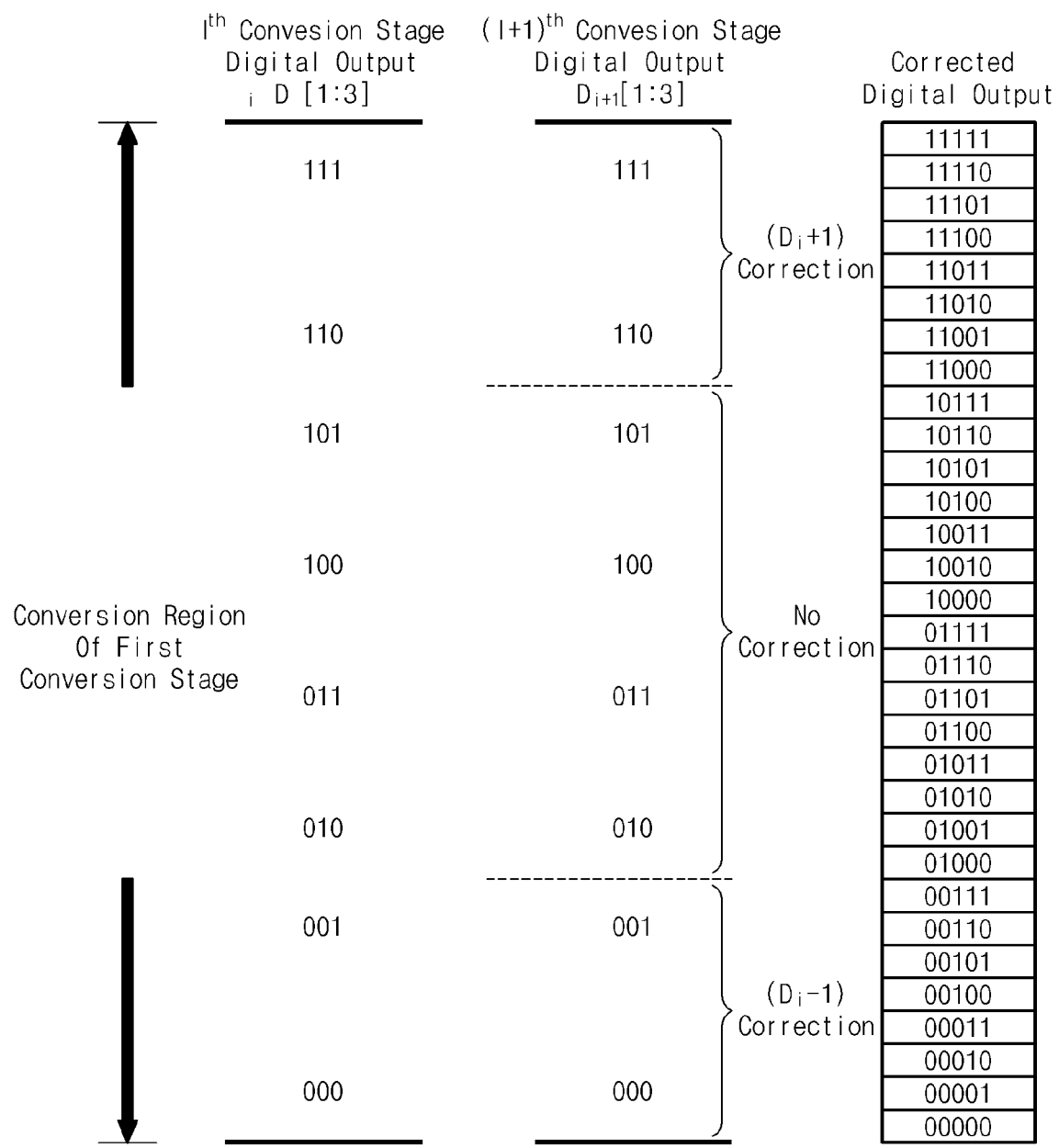
FIG. 7 is a diagram for describing a logic correction operation of a digital correction circuit in FIG. 6.

FIG. 7 is a diagram for describing a logic correction operation of a digital correction circuit in FIG. 6. For ease of description, a previous conversion stage may be referred to as the i$^{th}$ conversion stage, and a conversion stage following the previous conversion stage may be referred to as the (i+1)$^{th}$ conversion stage. It is assumed that a 3-bit analog-to-digital sub-converter 1102 (refer to FIG. 2) is used.

When a residual voltage of the i$^{th}$ conversion stage is applied as an input signal of the (i+1)$^{th}$ conversion stage, ideally, the (i+1)$^{th}$ conversion stage may convert digital codes of '101', '100', '011', and '010'

If a digital code of the (i+1)$^{th}$ conversion stage has values of '111' and '110', a digital code of the i$^{th}$ conversion stage may mean that a bit error of −1 is generated. A subtracter/adder 1210 may correct the digital code by +1.

On the other hand, if a digital code of (i+1)$^{th}$ conversion stage has values of '000 and '001, a digital code of the i$^{th}$ conversion stage may mean that a bit error of +1 is generated. The subtracter/adder 1210 may correct the digital code by −1. Finally, 5-bit output data expressed at a right side of FIG. 7 may be a corrected digital code output by a logic correction operation.

Figure 8:
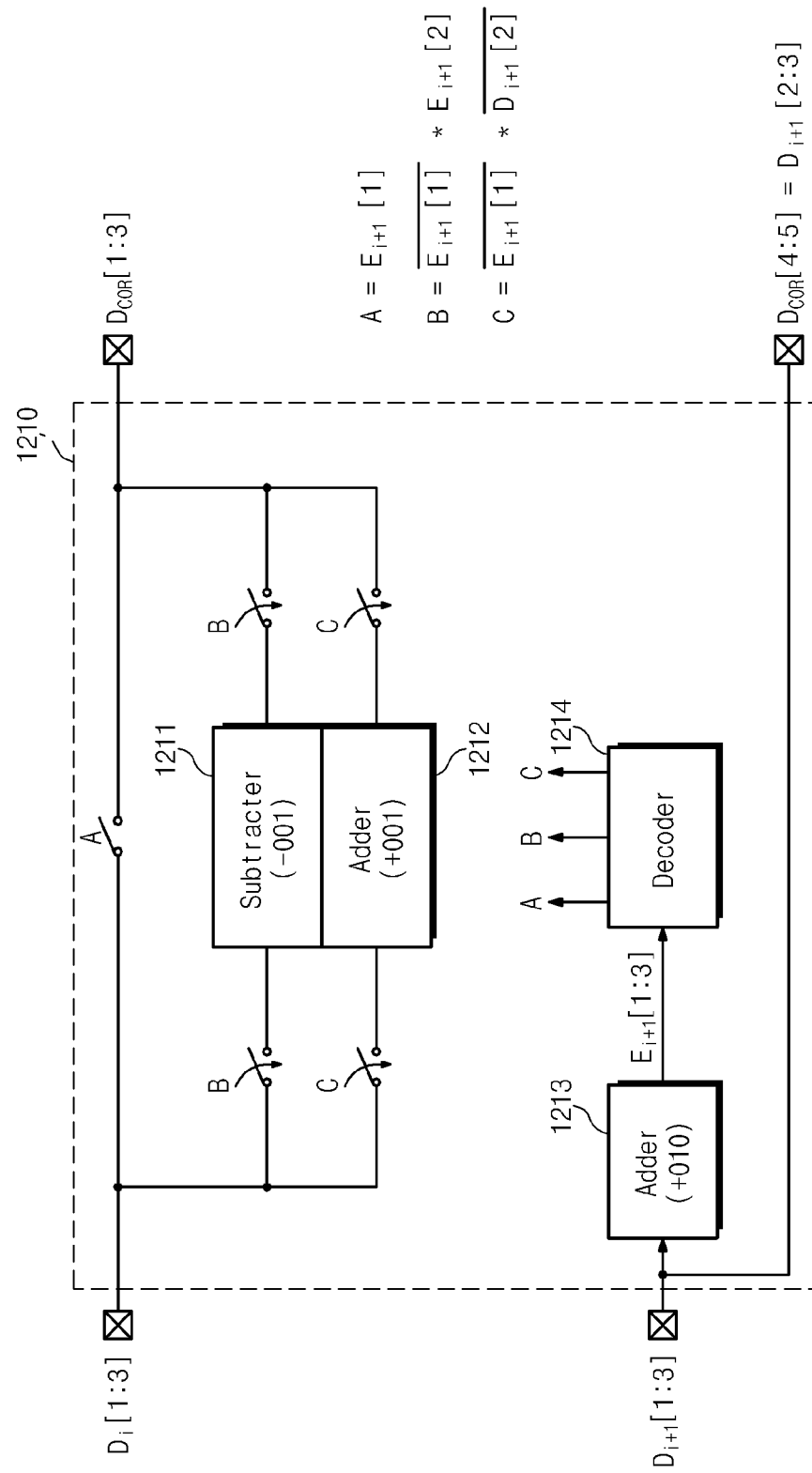
FIG. 8 is a diagram illustrating a subtracter/adder block in FIG. 5 according to an exemplary embodiment of the inventive concept.

FIG. 8 is a diagram illustrating a subtracter/adder block in FIG. 5 according to an exemplary embodiment of the inventive concept. Referring to FIG. 8, a subtracter/adder block 1210 may include a subtracter 1211, the first and second adders 1212 and 1213, and a decoder 1214. For ease of description, it is assumed that a previous conversion stage may be referred to as the i$^{th}$ conversion stage, and a current conversion stage following the previous conversion stage may be referred to as the (i+1)$^{th}$ conversion stage.

The subtracter/adder block 1210 may output upper bits $D_{COR}[1:3]$ of a corrected output signal $D_{COR}$ by outputting a digital code $D_i[1:3]$ provided from the i$^{th}$ conversion stage in response to a signal A without modification, by making subtraction on the digital code $D_i[1:3]$ in response to a signal B, or by making addition on the digital code $D_i[1:3]$ in response to a signal C. The subtracter/adder block 1210 may output a digital code $D_{i+1}[1:3]$ provided from the (i+1)$^{th}$ conversion stage as lower bits $D_{COR}[4:5]$ of the corrected output signal $D_{COR}$. Herein, 'A' may be $E_{i+1}[1]$, 'B' may be $\overline{E_{i+1}[1]} \times E_{i+1}[2]$, and 'C' may be $\overline{E_{i+1}[1]} \times \overline{E_{i+1}[2]}$. The lower bits $D_{COR}[4:5]$ may be bits $D_{i+1}[2:3]$ of the (i+1)$^{th}$ conversion stage. Herein, $E_{i+1}$ may be a value obtained by adding a predetermined value (e.g., '010') to a digital code $D_{i+1}$.

In response to the signal B, the subtracter 1211 may output a value, obtained by subtracting a value of '001' from the digital code $D_i[1:3]$ of the i$^{th}$ conversion stage, as the upper bits $D_{COR}[1:3]$ of the output signal $D_{COR}$.

In response to the signal C, the first adder 1212 may output a value, obtained by adding a value of '001' to the digital code $D_i[1:3]$ of the i$^{th}$ conversion stage, as the upper bits $D_{COR}[1:3]$ of the output signal $D_{COR}$.

The second adder 1213 may make a binary shift operation by adding a value of '010' to the digital code $D_i[1:3]$ of the conversion stage and may output a *shift* code $E_{i+1}[1:3]$.

The decoder 1214 may generate the signals A, B, and C for switching paths of digital codes of the i$^{th}$ conversion stage in response to the shift code $E_{i+1}[1:3]$ output from the second adder 1214.

To reduce an area of the decoder 1214, a digital code $D_{i+1}[1:3]$ transferred from the (i+1)$^{th}$ conversion stage may be binary shifted by locating the second adder 1213 for adding a digital code of '010' to a digital code $D_{i+1}[1:3]$ input to the decoder 1214. For this reason, as illustrated in FIG. 8, logic expressions of determining path switching signals A, B, and C may be simple, so that an area of the decoder 1214 is reduced.

A digital conversion method of a pipelined analog-to-digital converter according to an exemplary embodiment of the inventive concept may include converting an input signal into a digital code at a first conversion stage; in a plurality of serially connected conversion stages, converting a residual voltage from a previous conversion stage into a digital code to output a residual voltage to a next stage; and performing a logic correction operation by binary shifting the digital code from the first conversion stage and the digital codes from the plurality of serially connected conversion stages.

In an exemplary embodiment, when the digital code is a 3-bit code, the binary shifting may be made by adding a value of '010' to the digital code at the logic correction operation.

The pipelined analog-to-digital converter according to an exemplary embodiment of the inventive concept may easily carry a logic correction operation via binary shifting at data error correction. Accordingly, although the resolution increases, the complexity of a logic circuit may be reduced.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A pipelined analog-to-digital converter comprising:
   a conversion stage part including a plurality of serially connected conversion stages, each of the plurality of serially connected conversion stages converting an input voltage a B-bit digital code in response to at least one clock signal and outputting a residual voltage; and a digital correction circuit configured to perform a logic correction operation by binary shifting the B-bit digital codes output from the plurality of serially connected conversion stages, wherein each of the plurality of serially connected conversion stages comprises:

a multiplying digital-to-analog converter configured to convert a $(2^B-1)$-bit digital code into an analog signal in response to the at least one clock signal and to output the residual voltage by subtracting the converted analog signal from the input voltage; and an analog-to-digital sub-converter configured to convert the input voltage into the $(2^B-1)$-bit digital code and the B-bit digital code, wherein the multiplying digital-to-analog converter comprises:

a first sampler configured to sample the input voltage in response to a first clock signal;

a digital-to-analog converter configured to convert the $(2^B-1)$-bit digital code into the analog signal in response to a second clock signal;

a subtracter configured to subtract an output value of the digital-to-analog converter from an output of the first sampler; and a residual voltage amplifier configured to output the residual voltage by amplifying an output value of the subtracter in response to the second clock signal.

2. The pipelined analog-to-digital converter of claim 1, further comprising:

a clock signal generator configured to generate the at least one clock signal.

3. The pipelined analog-to-digital converter of claim 1, further comprising:

a reference voltage buffer configured to generate a reference voltage.

4. The pipelined analog-to-digital converter of claim 1, wherein the first and second clock signals are complementary.

5. The pipelined analog-to-digital converter of claim 4, wherein the multiplying digital-to-analog converter performs a sampling operation in response to the first clock signal and a residual voltage amplifying operation in response to the second clock signal, and wherein if one of continuous conversion stages in the conversion stage part performs a sampling operation, the other performs a residual voltage amplifying operation.

6. The pipelined analog-to-digital converter of claim 1, wherein the analog-to-digital sub-converter comprises:

a second sampler configured to sample the input voltage in response to the first clock signal;

a preprocessing amplifier string configured to amplify an output value of the second sampler;

a latch string configured to latch an output value of the preprocessing amplifier string in response to the second clock signal and to output the $(2^B-1)$-bit digital code; and a decoder configured to decode an output value of the latch string into the B-bit digital code.

7. The pipelined analog-to-digital converter of claim 1, wherein the digital correction circuit comprises:

a plurality of delay cells configured to delay the B-bit digital codes output from the plurality of serially connected conversion stages; and a subtracter/adder block configured to perform the logic correction operation by binary shifting the delayed digital codes corresponding to the plurality of serially connected conversion stages, respectively.

8. The pipelined analog-to-digital converter of claim 7, wherein the subtracter/adder block receives the delayed digital codes each corresponding to the plurality of serially connected conversion stages in response to a first clock signal.

9. The pipelined analog-to-digital converter of claim 7, wherein in continuous $i^{th}$ and $(i+1)^{th}$ conversion stages of the plurality of serially connected conversion stages, the logic correction operation is performed such that one bit of a first digital code output from the $i^{th}$ conversion stage is overlapped with one bit of a second digital code output from the $(i+1)^{th}$ conversion stage.

10. The pipelined analog-to-digital converter of claim 9, wherein when the second digital code output from the $(i+1)^{th}$ conversion stage is '000' or '001', '1' is subtracted from the first digital code at the logic correction operation.

11. The pipelined analog-to-digital converter of claim 9, wherein when the second digital code output from the $(i+1)^{th}$ conversion stage is '111' or '110', '1' is added to the first digital code at the logic correction operation.

12. The pipelined analog-to-digital converter of claim 9, wherein when the second digital code output from the $(i+1)^{th}$ conversion stage is '101', '100', '011', or '010', the first digital code is not corrected at the logic correction operation.

13. A pipelined analog-to-digital converter comprising:

a conversion stage part including a plurality of serially connected conversion stages, each of the plurality of serially connected conversion stages converting an input voltage a B-bit digital code in response to at least one clock signal and outputting a residual voltage; and a digital correction circuit configured to perform a logic correction operation by binary shifting the B-bit digital codes output from the plurality of serially connected conversion stages, wherein the digital correction circuit comprises:

a plurality of delay cells configured to delay the B-bit digital codes output from the plurality of serially connected conversion stages; and a subtracter/adder block configured to perform the logic correction operation by binary shifting the delayed digital codes corresponding to the plurality of serially connected conversion stages, respectively, wherein in continuous $i^{th}$ and $(i+1)^{th}$ conversion stages of the plurality of serially connected conversion stages, the logic correction operation is performed such that one bit of a first digital code outputted from the $i^{th}$ conversion stage is overlapped with one bit of a second digital code outputted from the $(i+1)^{th}$ conversion stage, wherein the subtracter/adder block is configured to output the first digital code of the $i^{th}$ conversion stage as upper bits of a corrected digital code and remaining bits other than a most significant bit of the second digital code of the $(i+1)^{th}$ conversion stage as lower bits of the corrected digital code in response to a first signal, and comprises:

a subtracter configured to output a value, obtained by subtracting a first predetermined value from the first digital code of the $i^{th}$ conversion stage, as the upper bits of the corrected digital code in response to a second signal;

a first adder configured to output a value, obtained by adding the first predetermined value to the first digital code of the $i^{th}$ conversion stage, as the upper bits of the corrected digital code in response to a third signal;

a second adder configured to output a shift code by adding a second predetermined value to the second digital code; and a decoder configured to generate the first, second, and third signals in response to the shift code.

14. The pipelined analog-to-digital converter of claim 13, wherein the first signal is a first bit value of the shift code.

15. The pipelined analog-to-digital converter of claim 13, wherein the second signal is a value obtained by multiplying an inverted version of the first bit value of the shift code and a second bit value of the shift code.

16. The pipelined analog-to-digital converter of claim 13, wherein the third signal is a value obtained by multiplying an inverted version of the first bit value of the shift code and an inverted version of the second bit value of the shift code.

17. The pipelined analog-to-digital converter of claim 13, wherein the first predetermined value is '001'.

18. The pipelined analog-to-digital converter of claim 13, wherein the second predetermined value is '010'.

* * * * *